(12) United States Patent
Sugimae et al.

(10) Patent No.: US 7,906,816 B2
(45) Date of Patent: Mar. 15, 2011

(54) SEMICONDUCTOR INTEGRATED CIRCUIT DEVICE INCLUDING MEMORY CELLS HAVING FLOATING GATES AND RESISTOR ELEMENTS

(75) Inventors: Kikuko Sugimae, Yokohama (JP); Takeshi Kamigaichi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 394 days.

(21) Appl. No.: 11/346,292

(22) Filed: Feb. 3, 2006

(65) Prior Publication Data

US 2006/0267143 A1    Nov. 30, 2006

(30) Foreign Application Priority Data

May 31, 2005    (JP) ................... 2005-159391

(51) Int. Cl.
*H01L 27/11* (2006.01)
(52) U.S. Cl. ................ 257/379; 257/536; 257/E27.071
(58) Field of Classification Search .................. 256/364, 256/366, 314, 315, 316, 536, 538; 257/364, 257/366, 314, 315, 316, 536, 538, 379, E27.016, 257/E27.071
See application file for complete search history.

(56) References Cited

U.S. PATENT DOCUMENTS

| | | | | |
|---|---|---|---|---|
| 4,682,402 A * | 7/1987 | Yamaguchi | ................... | 438/384 |
| 6,228,714 B1 * | 5/2001 | Choi | ................... | 438/258 |
| 6,893,918 B1 * | 5/2005 | Wang et al. | ................... | 438/257 |
| 2002/0070402 A1 * | 6/2002 | Ichige et al. | ................... | 257/296 |
| 2002/0127802 A1 * | 9/2002 | Goda et al. | ................... | 438/257 |
| 2003/0205756 A1 * | 11/2003 | Ichige et al. | ................... | 257/315 |
| 2004/0140508 A1 * | 7/2004 | Sengoku et al. | ................... | 257/379 |

FOREIGN PATENT DOCUMENTS

| | | |
|---|---|---|
| JP | 59-210658 | 11/1984 |
| JP | 9-82896 | 3/1997 |
| JP | 2001-77333 | 3/2001 |
| JP | 2001-284556 | 10/2001 |
| JP | 2002-110825 | 4/2002 |
| JP | 2002-110827 | 4/2002 |
| JP | 2003-174087 | 6/2003 |

* cited by examiner

*Primary Examiner* — Thao X Le
*Assistant Examiner* — Robert Huber
(74) *Attorney, Agent, or Firm* — Oblon, Spivak, McClelland, Maier & Neustadt, L.L.P.

(57) ABSTRACT

A semiconductor integrated circuit device includes an element isolation region which is formed in a semiconductor substrate to isolate an element region of the semiconductor substrate, memory cells having floating gates and formed on the element region, and resistor elements formed on the element region. The floating gate has a laminated structure containing a plurality of conductive films. The resistor element has a contact portion for connection with a wiring and a resistor portion acting as a resistor. The resistor portion has a laminated structure having at least one of the plurality of conductive films and an insulating material having a selective etching ratio with respect to the semiconductor substrate.

23 Claims, 13 Drawing Sheets

G-G cross section

Resistor element portion

FIG.12F
F-F cross section

FIG.12G
G-G cross section

FIG.12H
H-H cross section

SEMICONDUCTOR INTEGRATED CIRCUIT DEVICE INCLUDING MEMORY CELLS HAVING FLOATING GATES AND RESISTOR ELEMENTS

CROSS-REFERENCE TO RELATED APPLICATIONS

This application is based upon and claims the benefit of priority from prior Japanese Patent Application No. 2005-159391, filed May 31, 2005, the entire contents of which are incorporated herein by reference.

BACKGROUND OF THE INVENTION

1. Field of the Invention

This invention relates to a semiconductor integrated circuit device and a manufacturing method thereof, and more particularly to a semiconductor integrated circuit device having an electrically rewritable nonvolatile semiconductor memory device, and a manufacturing method thereof.

2. Description of the Related Art

A voltage is kept applied to a resistor element used in a timing circuit of an electrically rewritable nonvolatile semiconductor memory device, for example, a NAND flash memory at the standby time. Therefore, it is necessary to increase the resistance value. This is because it is desired to reduce a standby current.

The method for forming the resistor elements is disclosed in, for example, Jpn. Pat. Appln. KOKAI Publication No. 2002-110825 and Jpn. Pat. Appln. KOKAI Publication No. 2002-110827. According to Jpn. Pat. Appln. KOKAI Publication No. 2002-110825, the conductive layer used as a control gate is used as the resistor element. Further, according to Jpn. Pat. Appln. KOKAI Publication No. 2002-110827, first and second conductive layers used as a floating gate and a third conductive layer used as a control gate are used as the resistor element.

As is described in Jpn. Pat. Appln. KOKAI Publication No. 2002-110825 and Jpn. Pat. Appln. KOKAI Publication No. 2002-110827, a gate material is used to form the resistor element. The gate material is used as a gate, and therefore, it is desired to lower the resistance value. On the other hand, as described before, it is desired to increase the resistance value of the resistor element.

Thus, there are provided mutually conflicting requirements for the gate and resistor element.

BRIEF SUMMARY OF THE INVENTION

A semiconductor integrated circuit device according to a first aspect of the present invention comprises a semiconductor substrate, an element isolation region which is formed in the semiconductor substrate to isolate an element region of the semiconductor substrate, memory cells having floating gates and formed on the element region, the floating gate having a laminated structure containing a plurality of conductive films, and resistor elements formed on the element region, each resistor element having a contact portion for connection with a wiring and a resistor portion acting as a resistor, and the resistor portion having a laminated structure having at least one of the plurality of conductive films and an insulating material having a selective etching ratio with respect to the semiconductor substrate.

A manufacturing method of a semiconductor integrated circuit device according to a second aspect of the present invention comprises forming a first film used as floating gates on a semiconductor substrate, forming a mask member used when trenches are formed in the substrate on the first film used as the floating gates, forming trenches in the substrate through the first film by using the mask member as a mask, embedding insulating materials into the trenches, removing the mask member from contact portions of a memory cell array portion and resistor element portion, embedding second films used as floating gates into grooves formed by removing the mask member, forming gate-gate insulating films on exposed surfaces of the insulating materials, an exposed surface of the mask member and exposed surfaces of the second films, removing portions of the gate-gate insulating films which lie on the contact portions of the resistor element portion, and forming conductive films used as control gates on the gate-gate insulating films and portions from which the gate-gate insulating films are removed.

DETAILED DESCRIPTION OF THE INVENTION

There will now be described one embodiment of this invention with reference to the accompanying drawings. In this explanation, common reference symbols are attached to like portions throughout the drawings.

Figure 1A:
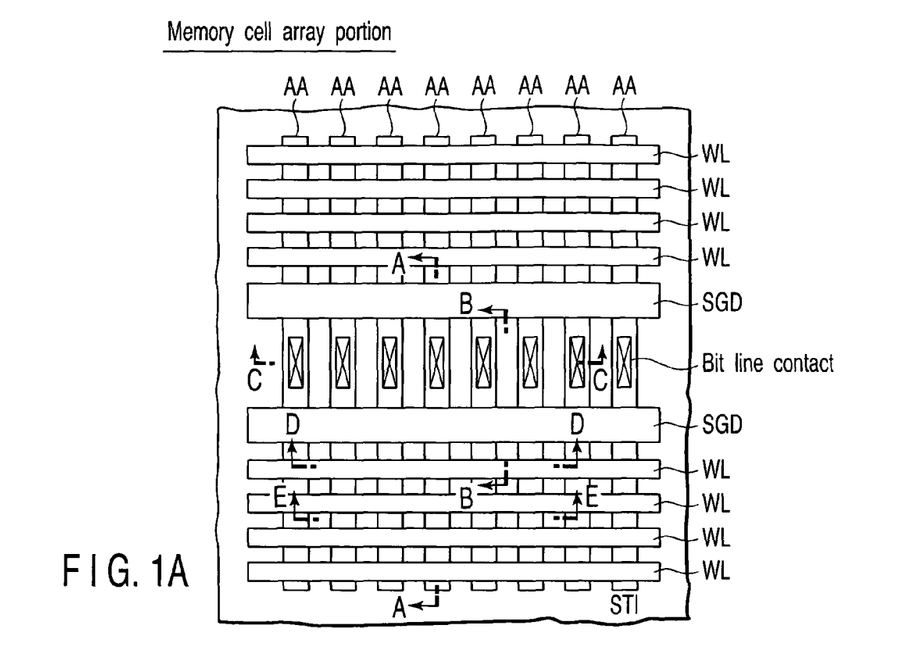
FIGS. 1A and 1B are plan views each showing an example of a plane pattern of a semiconductor integrated circuit device according to one embodiment of this invention.
Figure 1B:
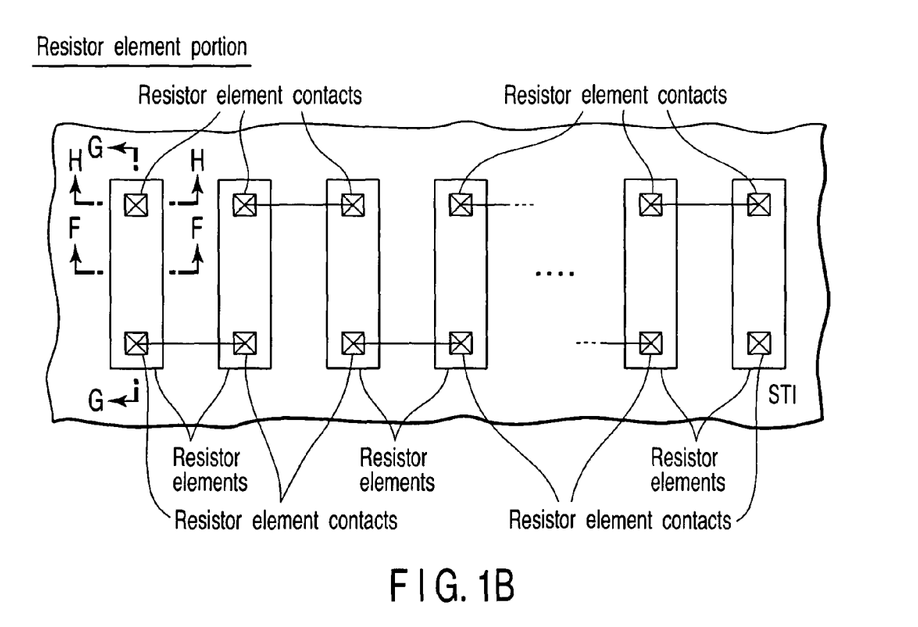
Figures 2A, 2B:
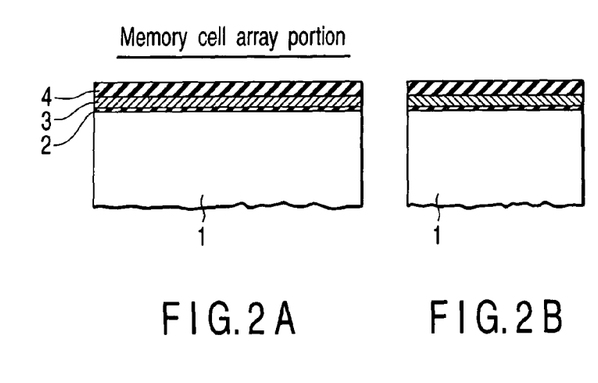
FIGS. 2A to 2H are cross sectional views showing one manufacturing step of a semiconductor integrated circuit device according to one embodiment of this invention.
Figure 2C:
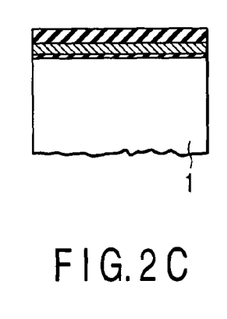
Figure 2D:
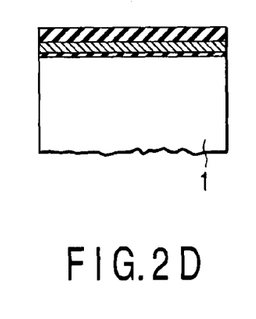
Figure 2E:
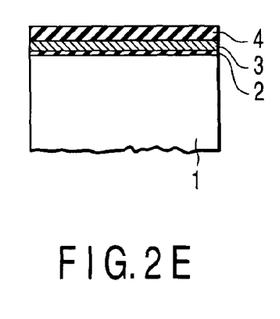
Figure 2F:
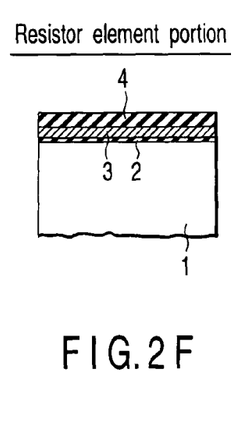
Figure 2G:
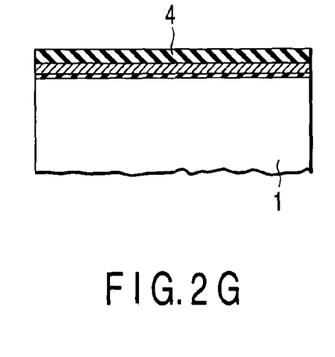
Figure 2H:
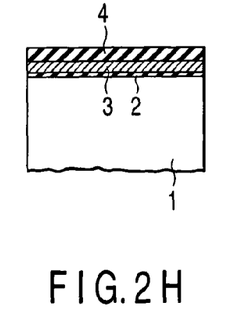
Figure 3A:
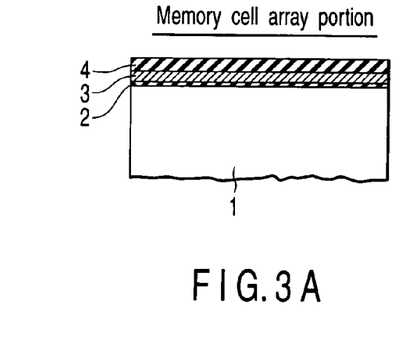
FIGS. 3A to 3H are cross sectional views showing one manufacturing step of the semiconductor integrated circuit device according to one embodiment of this invention.
Figure 3B:
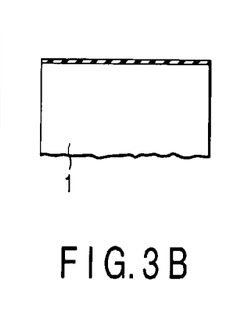
Figure 3C:
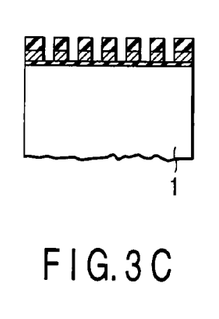
Figure 3D:
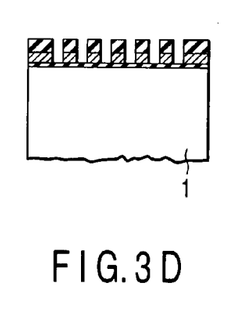
Figure 3E:
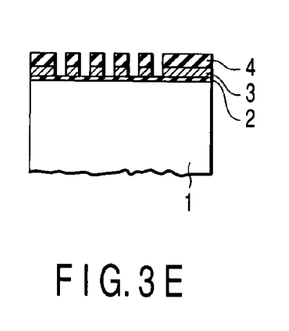
Figure 3F:
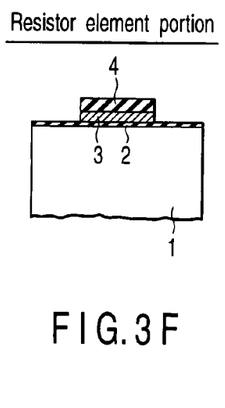
Figure 3G:
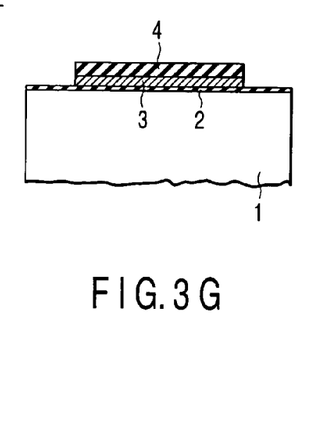
Figure 3H:
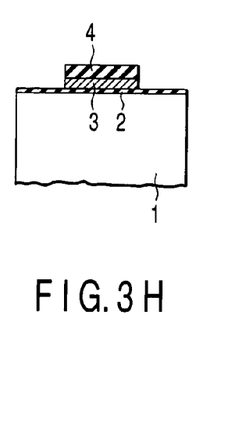
Figure 4A:
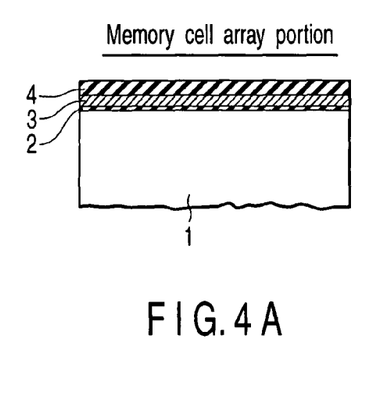
FIGS. 4A to 4H are cross sectional views showing one manufacturing step of the semiconductor integrated circuit device according to one embodiment of this invention.
Figure 4B:
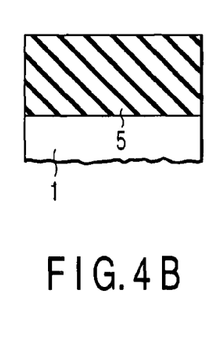
Figure 4C:
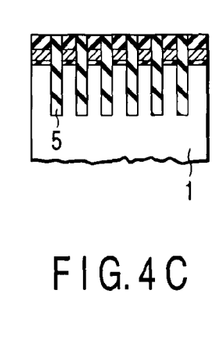
Figure 4D:
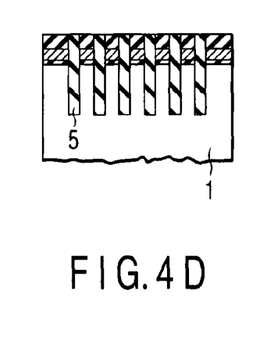
Figure 4E:
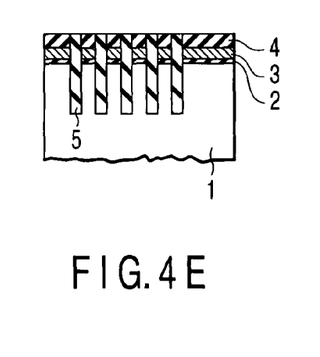
Figure 4F:
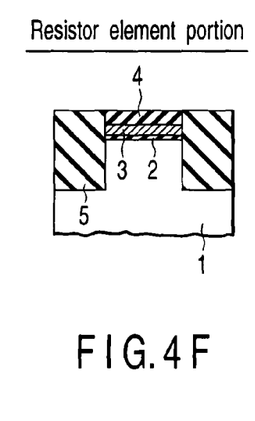
Figure 4G:
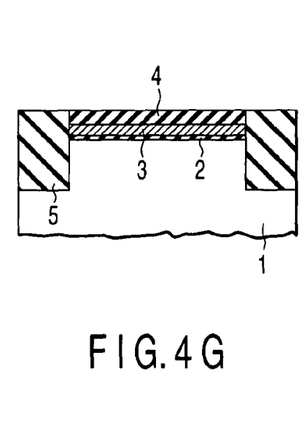
Figure 4H:
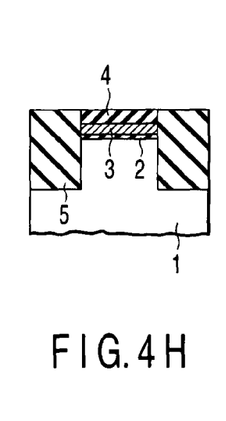
Figure 5A:
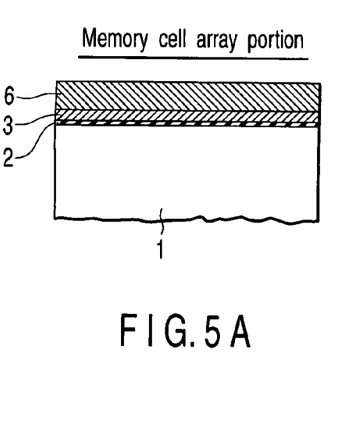
FIGS. 5A to 5H are cross sectional views showing one manufacturing step of the semiconductor integrated circuit device according to one embodiment of this invention.
Figure 5B:
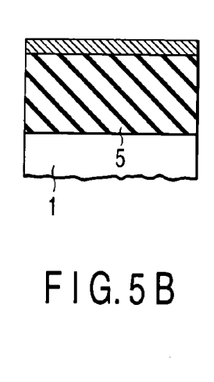
Figure 5C:
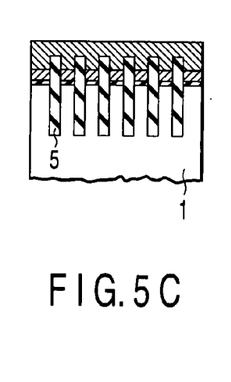
Figure 5D:
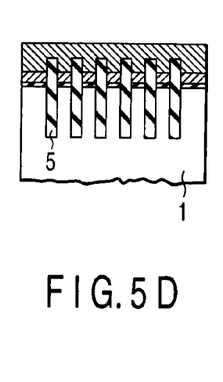
Figure 5E:
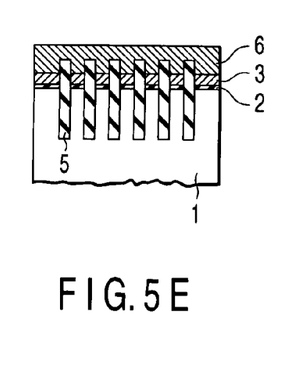
Figures 5F, 5G:
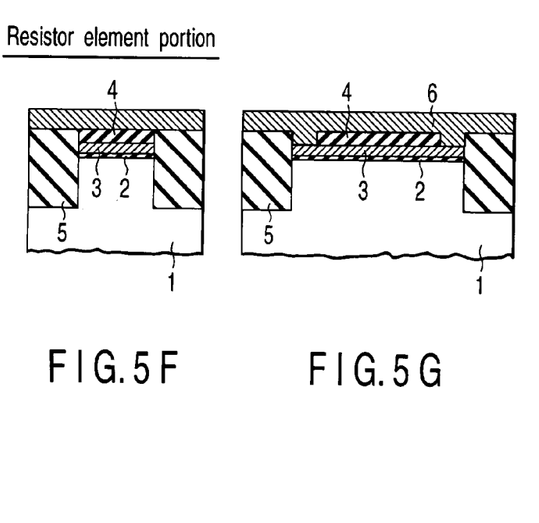
Figure 5H:
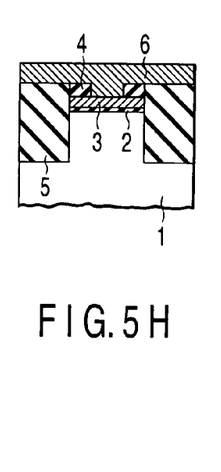
Figure 6A:
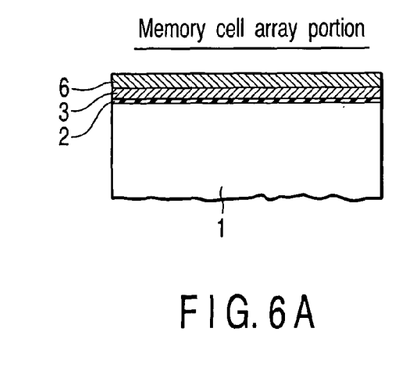
FIGS. 6A to 6H are cross sectional views showing one manufacturing step of the semiconductor integrated circuit device according to one embodiment of this invention.
Figure 6B:
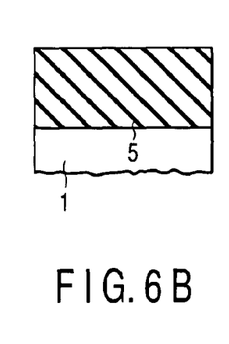
Figure 6C:
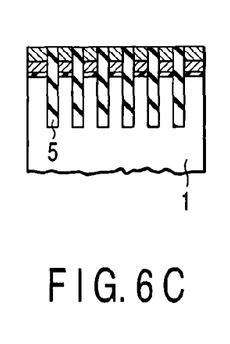
Figure 6D:
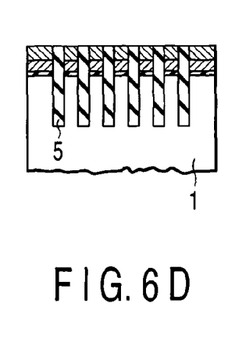
Figure 6E:
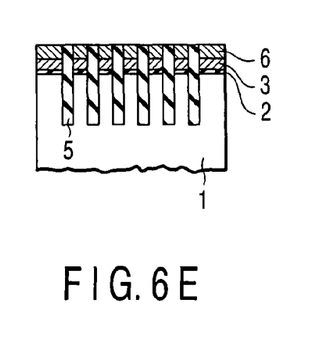
Figure 6F:
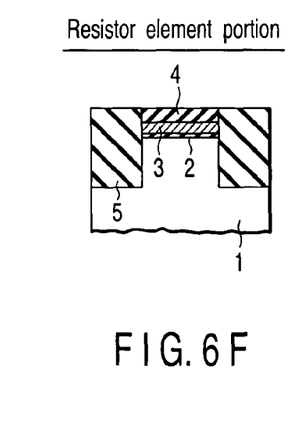
Figure 6G:
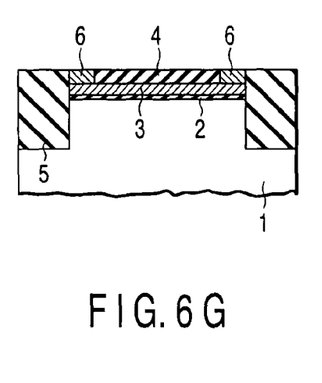
Figure 6H:
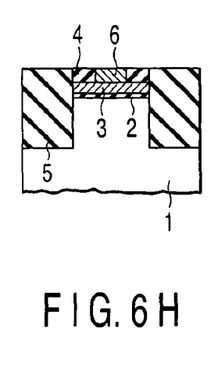
Figure 7A:
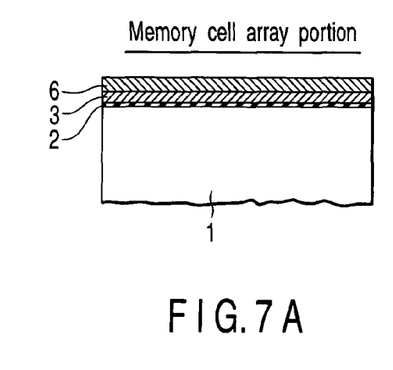
FIGS. 7A to 7H are cross sectional views showing one manufacturing step of the semiconductor integrated circuit device according to one embodiment of this invention.
Figure 7B:
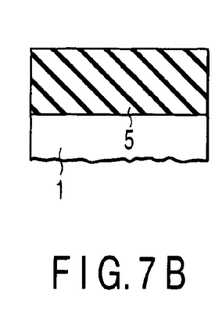
Figure 7C:
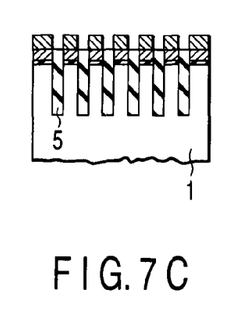
Figure 7D:
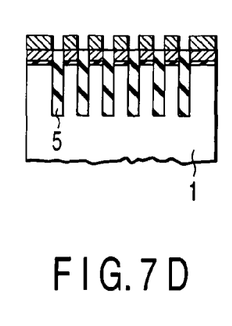
Figure 7E:
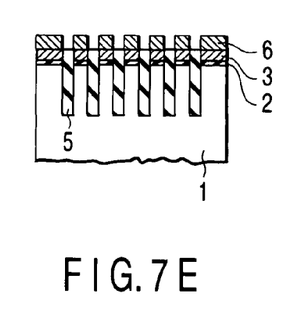
Figure 7F:
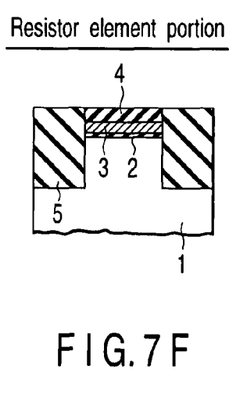
Figure 7G:
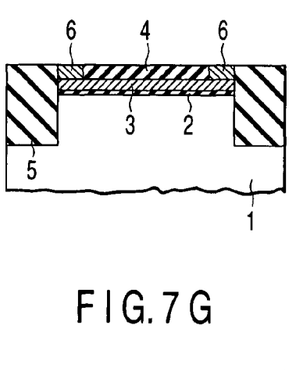
Figure 7H:
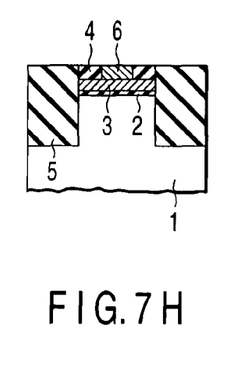
Figure 8A:
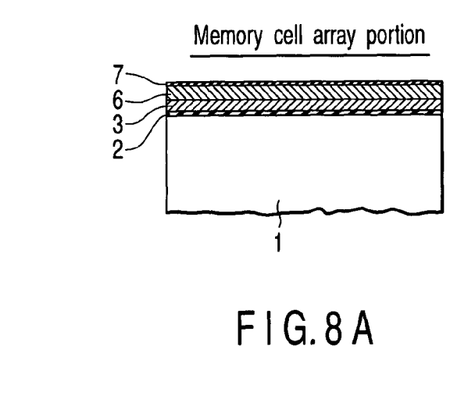
FIGS. 8A to 8H are cross sectional views showing one manufacturing step of the semiconductor integrated circuit device according to one embodiment of this invention.
Figure 8B:
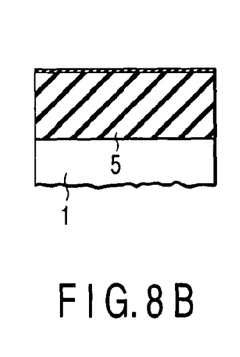
Figure 8C:
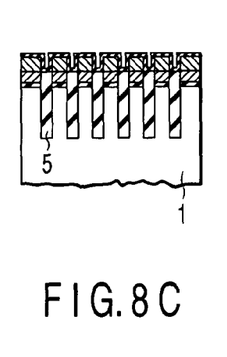
Figure 8D:
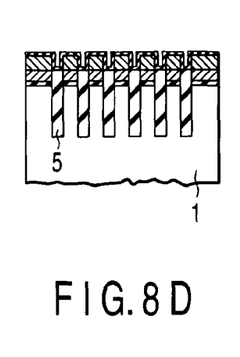
Figure 8E:
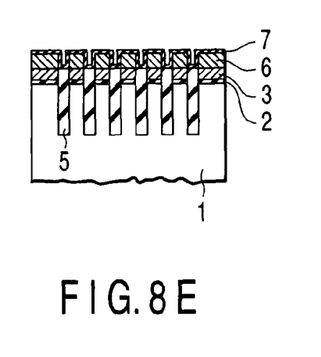
Figure 8F:
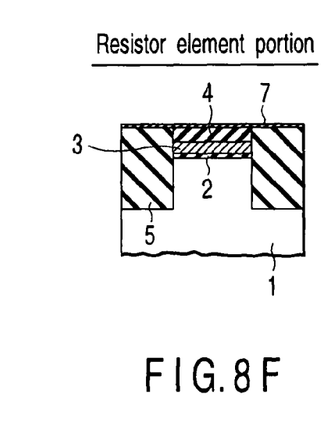
Figure 8G:
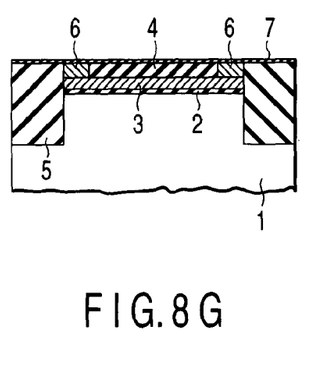
Figure 8H:
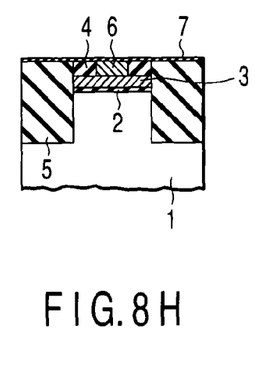
Figures 9A, 9B:
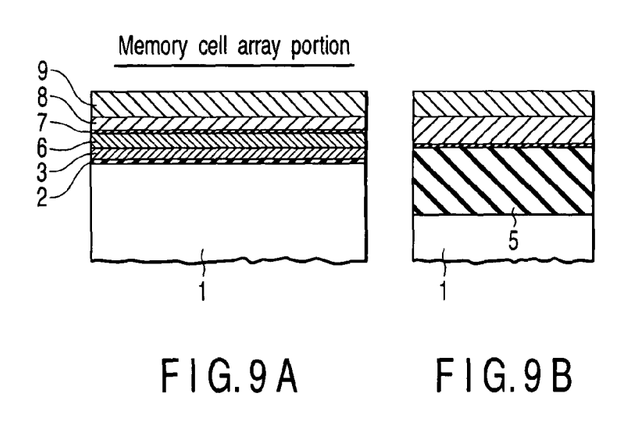
FIGS. 9A to 9H are cross sectional views showing one manufacturing step of the semiconductor integrated circuit device according to one embodiment of this invention.
Figure 9C:
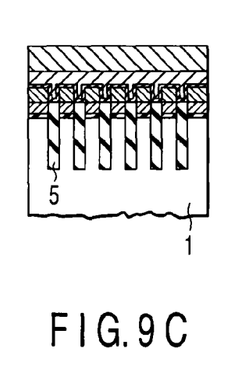
Figure 9D:
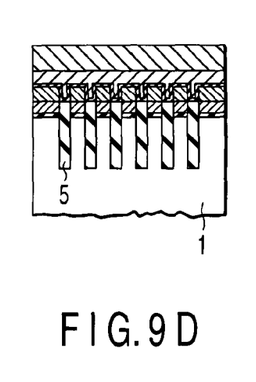
Figure 9E:
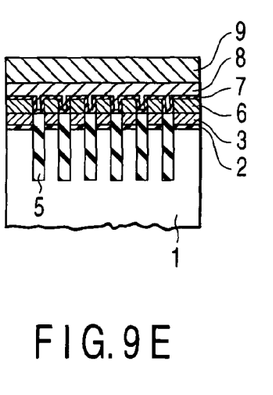
Figure 9F:
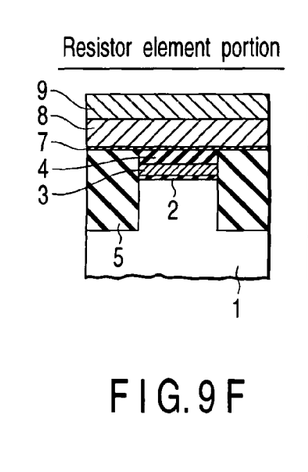
Figure 9G:
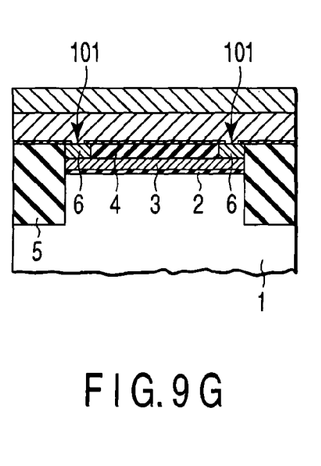
Figure 9H:
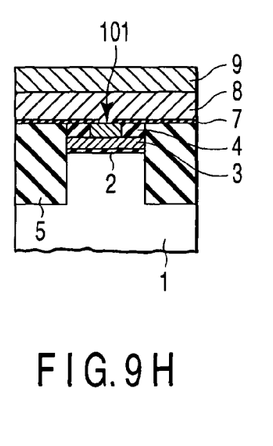
Figure 10A:
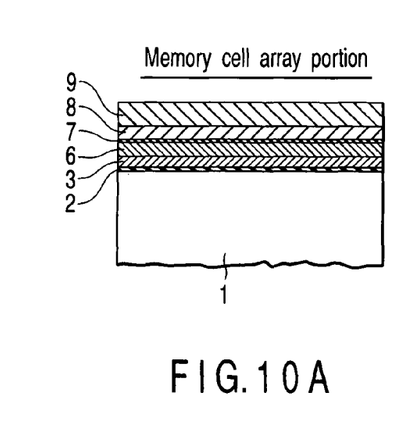
FIGS. 10A to 10H are cross sectional views showing one manufacturing step of the semiconductor integrated circuit device according to one embodiment of this invention.
Figure 10B:
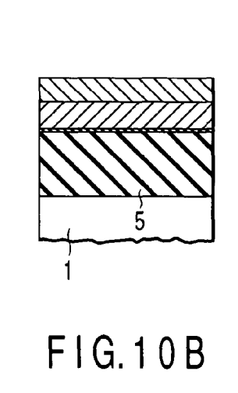
Figure 10C:
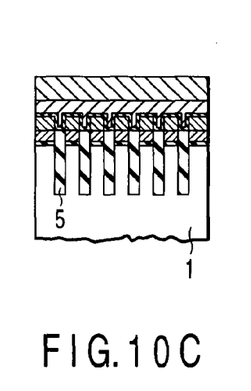
Figure 10D:
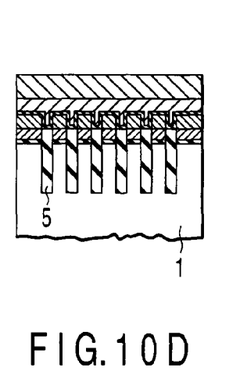
Figure 10E:
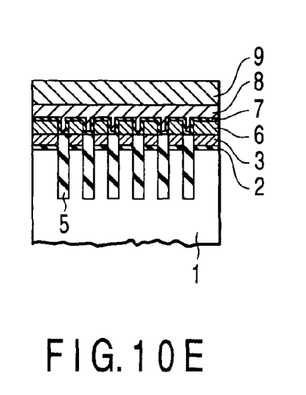
Figure 10F:
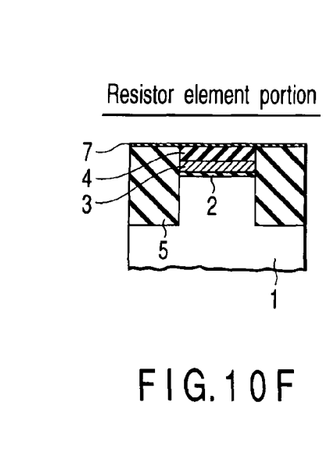
Figure 10G:
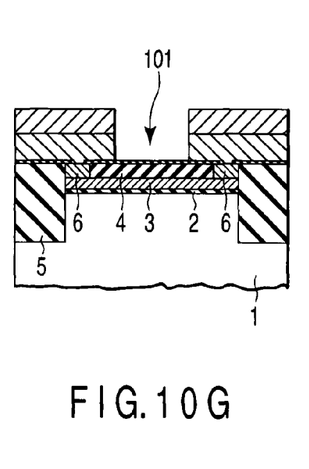
Figure 10H:
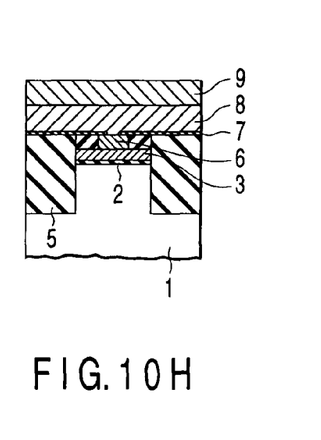
Figure 11A:
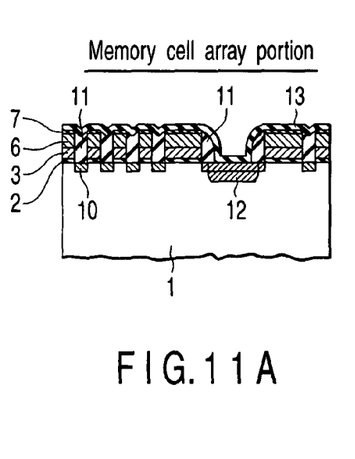
FIGS. 11A to 11H are cross sectional views showing one manufacturing step of the semiconductor integrated circuit device according to one embodiment of this invention.
Figure 11B:
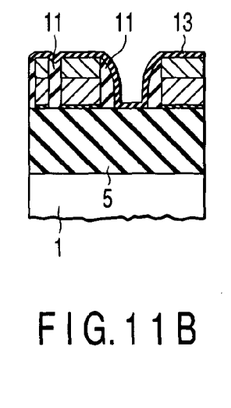
Figure 11C:
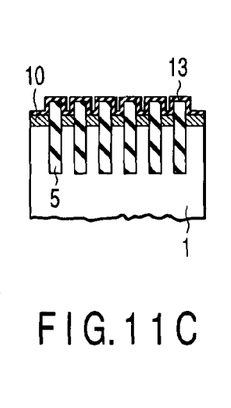
Figure 11D:
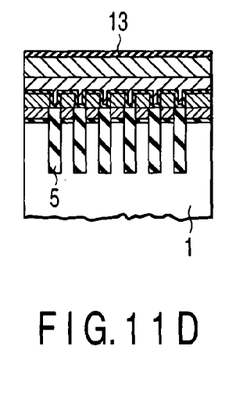
Figure 11E:
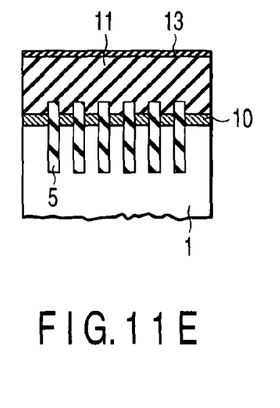
Figure 11F:
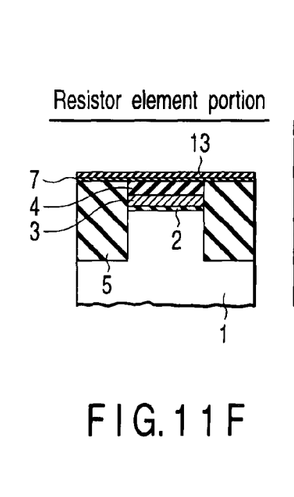
Figure 11G:
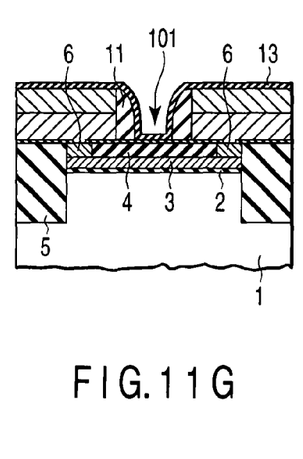
Figure 11H:
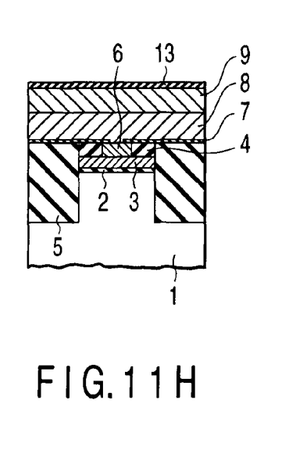
Figure 12A:
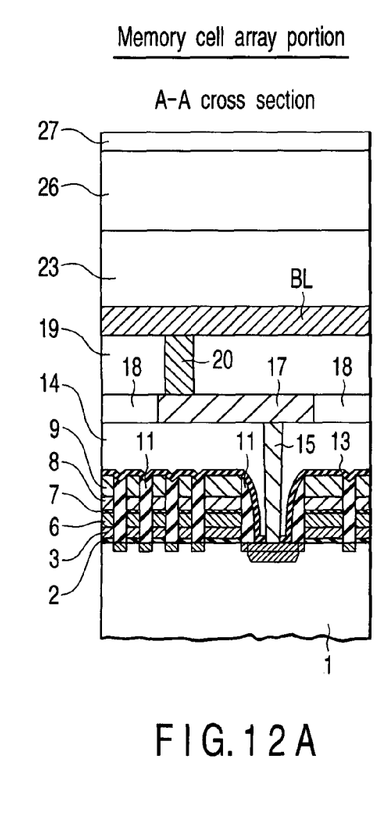
FIGS. 12A to 12H are cross sectional views showing an example of the structure of a memory cell array portion of a semiconductor integrated circuit device according to one embodiment of this invention, and an example of the structure of a resistor element portion of the semiconductor integrated circuit device according to one embodiment of this invention.
Figure 12B:
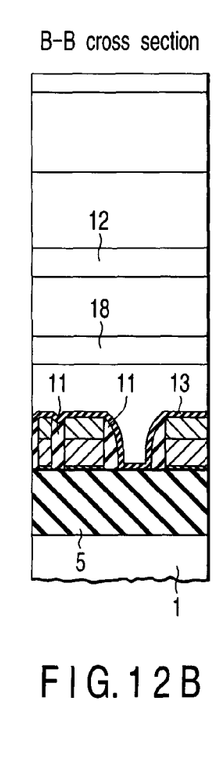
Figure 12C:
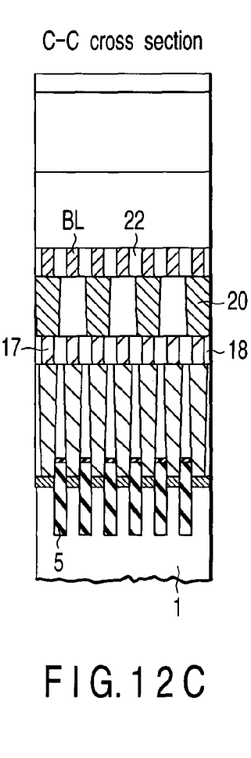
Figure 12D:
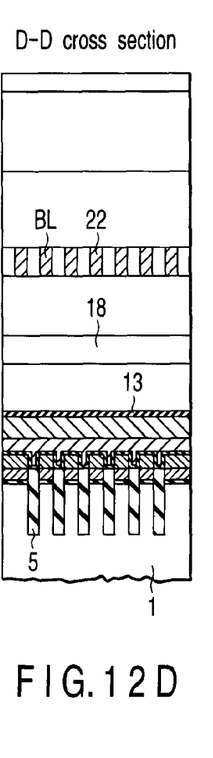
Figure 12E:
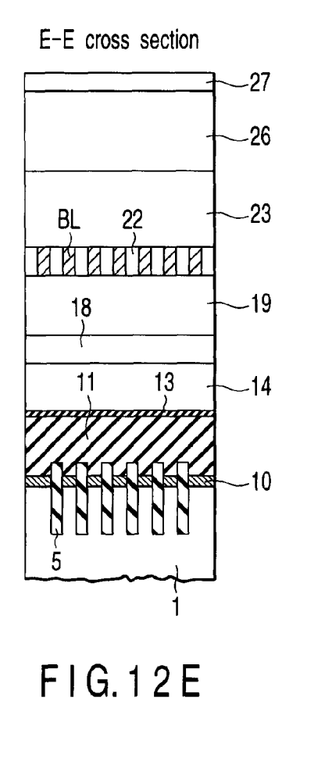
Figure 12F:
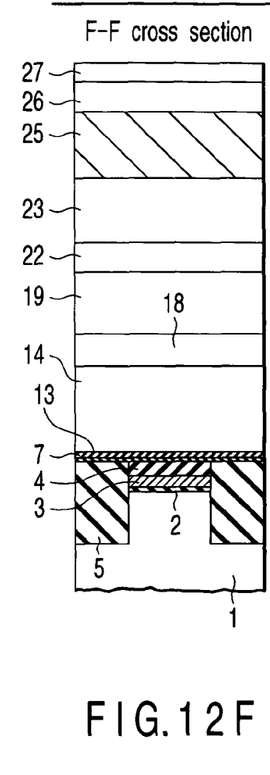
Figure 12G:
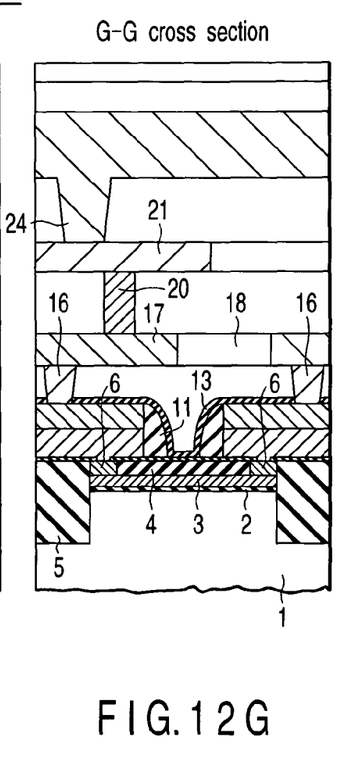
Figure 12H:
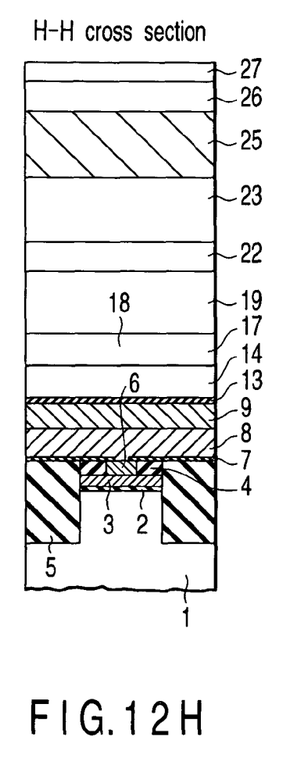

FIGS. 1A and 1B are plan views each showing an example of a plane pattern of a semiconductor integrated circuit device according to one embodiment of this invention. In this example, a NAND flash memory is shown, but this embodiment can also be applied to an electrically rewritable non-volatile semiconductor memory device other than the NAND flash memory.

FIG. 1A shows a memory cell array portion and FIG. 1B shows a resistor element portion. Like the memory cell array portion, the resistor element portion is formed on the same chip. Further, in FIG. 1A, word lines WL and block selection lines SG (in the drawing, only lines SGD are shown) and wirings lying above these wirings are omitted.

The semiconductor integrated circuit device according to one embodiment of this invention is explained by using one example of the manufacturing method thereof.

FIG. 2 (FIGS. 2A to 2H) to FIG. 11 (FIGS. 11A to 11H) are cross sectional views showing the respective manufacturing steps of the semiconductor integrated circuit device according to the present embodiment. In FIGS. 2 to 11, FIGS. 2A to 11A are cross sectional views taken along the line A-A of FIG. 1A. Likewise, FIGS. 2B to 11B are cross sectional views taken along the line B-B of FIG. 1B, FIGS. 2C to 11C are cross sectional views taken along the line C-C of FIG. 1A, FIGS. 2D to 11D are cross sectional views taken along the line D-D of FIG. 1A, and FIGS. 2E to 11E are cross sectional views taken along the line E-E of FIG. 1A. Further, FIGS. 2F to 11F are cross sectional views taken along the line F-F of FIG. 1B, FIG. G is a cross sectional views taken along the line G-G of FIG. 1B and FIGS. 2H to 11H are cross sectional view taken along the line H-H of FIG. 1B.

First, as shown in FIGS. 2A to 2H, the surface of a P-type silicon substrate (or P-type well) 1 is oxidized to form a silicon dioxide film (tunnel oxide film) 2. Then, conductive polysilicon is deposited on the silicon dioxide film 2 to form a conductive polysilicon film 3. The conductive polysilicon film 3 is used as floating gates in the memory cell array portion and used as resistor elements in the resistor element portion later. Next, silicon nitride is deposited on the conductive polysilicon film 3 to form a silicon nitride film 4. The silicon nitride film 4 is a cap member (mask member) used when shallow trenches are formed. Therefore, a material of the cap member is selected from materials having a selective etching ratio with respect to the semiconductor substrate and, in this example, an insulating material is used. Further, the cap member can be used as a stopper against polishing when an STI structure is formed by use of a CMP method. In this case, the material of the cap member is selected from materials having a selective etching ratio with respect to the semiconductor substrate and an insulating material used to form the STI structure and an insulating material may be used.

Then, as shown in FIGS. 3A to 3H, the silicon nitride film 4 and conductive polysilicon film 3 are patterned according to a pattern used to form an STI (Shallow Trench Isolation) structure.

Next, as shown in FIGS. 4A to 4H, shallow trenches are formed in the substrate 1 with the silicon nitride film 4 used as a mask. Then, insulating materials of, for example, silicon dioxide are embedded in the shallow trenches. After this, the insulating materials are made flat to form an STI structure 5. The STI structure 5 isolates an active area AA in the substrate 1.

Next, as shown in FIGS. 5A to 5H, the silicon nitride film 4 is removed from the memory cell array portion, transistor portion and wiring portion of a peripheral circuit (not shown) and contact portions of the resistor element portion. For example, the silicon nitride film 4 is left behind on a portion of the resistor element portion other than the contact portions thereof. Then, conductive polysilicon is deposited on the STI structure 5 and conductive polysilicon film 3 exposed by removing the silicon nitride film 4 to form a polysilicon film 6.

Next, as shown in FIGS. 6A to 6H, the conductive polysilicon film 6 is made flat by a CMP (Chemical Mechanical Polishing) method with the STI structure 5 used as a stopper, for example. As a result, the conductive polysilicon films 6 are embedded in grooves formed by removing the silicon nitride film 4. The process is a damascene process.

Next, as shown in FIGS. 7A to 7H, the STI structure 5 of the memory cell array portion is etched back to expose the side walls of the conductive polysilicon films 6 or the side walls of the conductive polysilicon films 3 and 6. The process is performed as required to increase capacitances Cono between control gates and floating gates of memory cells to be formed in the later process. In this example, the STI structure 5 of the resistor element portion is not etched back.

Then, as shown in FIGS. 8A to 8H, an insulating material is deposited on the structure shown in FIGS. 7A to 7G to form a gate-gate insulating film 7. One example of the gate-gate insulating film 7 is a so-called ONO film, which is a three-layered film of silicon dioxide/silicon nitride/silicon dioxide.

After this, as shown in FIGS. 9A to 9H, portions of the gate-gate insulating film 7 which lie on the contact portions of the resistor element portion are removed. The removed portion is indicated by a reference symbol 100. In this case, if a process of removing the gate-gate insulating film 7 from portions of block selection gate lines is performed, the above process can also be performed as this process. That is, it is possible to simultaneously remove the gate-gate insulating film 7 from the portions of the block selection gate lines of the memory cell array portion and the contact portions of the resistor element portion. Then, conductive polysilicon is deposited on the gate-gate insulating film 7 and the conductive polysilicon films 6 exposed to the removed portions 100 to form a conductive polysilicon film 8. Next, metal silicide is deposited on the conductive polysilicon film 8 to form a metal silicide film 9. Examples of the above metal are, tungsten, nickel, and cobalt. The laminated structure of the conductive polysilicon film 8 and metal silicide film 9 is called a polycide structure and is a low-resistance wiring member. In this example, the low-resistance wiring member is used to form control gates, for example, word lines WL, block selection gate lines SG, wirings in the peripheral circuit or the like.

Then, as shown in FIGS. 10A to 10H, a slit 101 is formed in a portion of the low-resistance wiring member (in this example, the conductive polysilicon film 8 and metal silicide film 9) which lies between the contact portions of the resistor element portion. By forming the slit 101, it becomes possible to connect the contact portions of the resistor element portion, for example, the conductive polysilicon films 6 to each other solely via the conductive polysilicon film 3.

Next, as shown in FIGS. 11A to 11H, the low-resistance wiring member (in this example, the conductive polysilicon film 8 and metal silicide film 9) is etched to form word lines WL, block selection gate lines SG, wirings and the like. Then, the etching process is continuously performed in the memory cell array portion to etch the gate-gate insulating film 7 and conductive polysilicon films 3, 6 to form floating gates. After this, N-type impurity is implanted into the substrate 1 with the word lines WL, block selection gate lines SG, wirings and STI structure 5 used as a mask to form diffusion layers 10. Then, for example, silicon dioxide is deposited on the structure obtained by etching to form a silicon dioxide film 11. Next, the silicon dioxide film 11 is subjected to an RIE (Reactive Ion Etching) process. Thus, for example, portions of the silicon dioxide film 11 are left behind in spaces between the word lines WL and between the word lines WL and the block selection gate lines SG and on the side walls of the block selection gate lines SG. Then, an N-type impurity is implanted into the substrate 1 with the word lines WL, block selection gate lines SG, wirings, STI structure 5 and silicon dioxide film 11 used as a mask to form diffusion layers 12. Next, for example, silicon nitride is deposited on the structure obtained by etching to form a silicon nitride film 13.

After this, bit lines, upper-layer wirings and the like are sequentially formed to complete a semiconductor integrated circuit device according to the present embodiment by use of a well known manufacturing method.

For example, as shown in FIGS. 12A to 12H, it is possible to sequentially perform the processes of forming a first-layered interlayer insulating film 14, forming contacts 15 between the substrate and first-layered metal films, forming first-layered metal films 17, forming a second-layered interlayer insulating film 18, making flat the second-layered interlayer insulating film 18, forming a third-layered interlayer insulating film 19, forming contacts 20 between the first-layered and second-layered metal films, forming second-layered metal films 22 (BL), forming fourth-layered interlayer insulating films 22, making flat the fourth-layered interlayer insulating films 22, forming a fifth-layered interlayer insulating film 23, forming contacts 24 between the second-layered and third-layered metal films, forming a third-layered metal film 25, forming a sixth-layered interlayer insulating film 26 and forming a passivation film 27.

In the semiconductor integrated circuit device according to the embodiment, the resistor element can be formed of a single-layered conductive film, in this example, by use of the conductive polysilicon film 3. The resistance of the resistor element formed by use of the single-layered conductive film can be set larger than that of the resistor element formed of a multi-layered conductive film, for example.

Further, the resistor element is formed with a laminated structure having at least one layer (in this example, the conductive polysilicon film 3) of the conductive film used as the floating gate of the laminated structure and a cap member (in this example, the silicon nitride film 4) used when shallow trenches are formed. With this structure, it is possible to attain an advantage that a resistor element having a larger resistance value in comparison with a resistor element using the floating gate itself of the laminated structure can be formed in the manufacturing process as that for forming memory cells.

Further, the word lines WL, block selection gate lines SG, wirings and the like can be formed by use of a multi-layered conductive film, in this example, the conductive polysilicon layer 8 and metal silicide film 9. Therefore, at this time, it is possible to satisfy the requirement of lowering the resistance of the gate or the resistance of the gate and wiring.

A method for increasing the wiring length is used in order to increase the resistance value of the resistor element formed by use of a conductive film with a plurality of layers. As a result, for example, when an attempt is made to decrease a standby current flowing in the timing circuit, there occurs a problem that it is necessary to enlarge the wiring length of the resistor element, and thus the chip area becomes larger.

On the other hand, according to the present embodiment, a sufficiently large resistance value can be attained without increasing the wiring length of the resistor element. Therefore, a standby current flowing in the timing circuit, for example, can be suppressed while an increase in the chip area is suppressed.

One example of the layout of the resistor element is shown in FIG. 1B. In this example, a plurality of resistor elements are serially connected to attain a larger resistance value. One example of the plane pattern of the resistor element is a rectangular form having short and long axes, and the plane patterns are linearly arranged with the long axes thereof set adjacent to one another. In this example, a plurality of resistor elements linearly arranged are connected in a zigzag form, for example, by using the laminated structure of the conductive polysilicon film 8 and metal silicide film 9 used for the word lines WL and block selection gate lines SG as contact portions and utilizing the wirings 17, 21 lying above the resistor elements or the laminated structure itself of the conductive polysilicon film 8 and metal silicide film 9. Thus, the plurality of resistor elements function as one series-connected resistor element.

An example of the layout of the resistor elements is not limited to this example, but according to the layout example of this example, a plurality of resistor elements are linearly arranged with the long axes set adjacent to one another. As a result, an advantage that a resistor element having a large resistance value can be formed in an compact plane area can be attained.

Further, if a plurality of resistor elements are used to form one series-connected resistor element, an advantage that the plane pattern of the resistor element having a large resistance value can be freely changed to a shape which can be easily laid out in the chip can be attained.

The above advantages are advantages which are preferable in forming the semiconductor integrated circuit device, for example, a NAND flash memory, in a highly integrated form.

According to the above embodiment, a semiconductor integrated circuit device having an electrically rewritable nonvolatile semiconductor memory device which can satisfy both of the requirements of lowering the resistance of the gate and increasing the resistance of the resistor element, and a manufacturing method thereof, can be provided.

As described above, this invention is explained with reference to the embodiment, but the embodiment of this invention is not limited to the above embodiment. This invention can be variously modified without departing from the technical scope thereof at the embodying stage.

For example, in the above embodiment, the number of laminated layers of the conductive film in the floating gate is two, but the number of laminated layers is not limited to two and can be set to three or more. When the number of laminated layers of the conductive film in the floating gate is set to three or more, the number of laminated layers of the conductive film in the resistor element is not limited to one. For example, if the number of laminated layers of the conductive film in the resistor portion acting as a resistor among the resistor elements is set smaller than the number of laminated layers of the conductive film in the floating gate, the same effect as that of the above embodiment can be attained.

Further, the above embodiment contains inventions at various stages, and inventions at various stages can be extracted by adequately combining a plurality of constituents disclosed in the embodiment.

The above embodiment is explained based on an example in which this invention is applied to the NAND flash memory, but this invention is not limited to the NAND flash memory and can be applied to a flash memory other than the NAND flash memory. For example, this invention can be applied to an AND or NOR flash memory. Further, a semiconductor integrated circuit device containing the above flash memory, for example, a processor system LSI or the like are contained in the scope of this invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
a semiconductor substrate;
an element isolation region which is formed in the semiconductor substrate to isolate an element region of the semiconductor substrate;
memory cells having floating gates and formed on the element region, the floating gate having a laminated structure with a plurality of conductive films;
resistor elements formed on the element region, each resistor element having a contact portion for connection with a wiring and a resistor portion acting as a resistor, the resistor portion having a laminated structure having at least one of the plurality of conductive films and an insulating layer formed on the plurality of conductive films, and a bottom surface of the insulating layer contacting to an upper surface of the resistor portion; and
wherein the contact portion includes a first structure and a second structure, the second structure is directly connected to the first structure via an opening formed in the insulating layer and a gate-gate insulating film, the gate-gate insulating film contacts to an upper surface of the insulating layer, and the insulating layer is flush with the element isolation region a top of the contact portion being at the same height with a top of the insulating layer, and the gate-gate insulating film is formed on the insulating layer.

2. The device according to claim 1, wherein the insulating layer has a selective etching ratio with respect to the element isolation region.

3. The device according to claim 1, wherein the first structure is the same as the laminated structure of the floating gate, and the insulating layer is formed between the second structure and the resistor portion.

4. The device according to claim 2, wherein the first structure is the same as the laminated structure of the floating gate, and the insulating layer is formed between the second structure and the resistor portion.

5. The device according to claim 3, wherein the second structure is the same as a control gate formed above the floating gate with the gate-gate insulating film disposed therebetween.

6. The device according to claim 4, wherein the second structure is the same as a control gate formed above the floating gate with the gate-gate insulating film disposed therebetween.

7. The device according to claim 1, wherein the number of laminated layers of the conductive film in the resistor portion is set smaller than the number of laminated layers of the conductive film in the floating gate.

8. The device according to claim 2, wherein the number of laminated layers of the conductive film in the resistor portion is set smaller than the number of laminated layers of the conductive film in the floating gate.

9. The device according to claim 3, wherein the number of laminated layers of the conductive film in the resistor portion is set smaller than the number of laminated layers of the conductive film in the floating gate.

10. The device according to claim 4, wherein the number of laminated layers of the conductive film in the resistor portion is set smaller than the number of laminated layers of the conductive film in the floating gate.

11. The device according to claim 5, wherein the number of laminated layers of the conductive film in the resistor portion is set smaller than the number of laminated layers of the conductive film in the floating gate.

12. The device according to claim 6, wherein the number of laminated layers of the conductive film in the resistor portion is set smaller than the number of laminated layers of the conductive film in the floating gate.

13. The device according to claim 1, wherein the insulating layer is made of silicon nitride.

14. The device according to claim 2, wherein the insulating layer is made of silicon nitride.

15. The device according to claim 3, wherein the insulating layer is made of silicon nitride.

16. The device according to claim 4, wherein the insulating layer is made of silicon nitride.

17. The device according to claim 5, wherein the insulating layer is made of silicon nitride.

18. The device according to claim 6, wherein the insulating layer is made of silicon nitride.

19. A semiconductor integrated circuit device comprising:
a semiconductor substrate;
a first element isolation region and a second element isolation region which are formed in the semiconductor substrate to isolate a first element region and a second element region of the semiconductor substrate, respectively;
memory cells formed in the first element region and each having a floating gate and a control gate, the floating gate being in contact with the first element isolation region and a top surface of the floating gate being located lower than a top surface of the first element isolation region, and the control gate being formed on the floating gate with a gate-gate insulating film therebetween; and
resistor elements formed on the second element region,
wherein the floating gates have a laminated structure having a lower conductive film made of at least one conductive film, and an upper conductive film made of at least one conductive film formed on the lower conductive film, and wherein
the resistor elements include a resistor portion which is formed of the same conductive film as the lower conductive film formed on the second element region and acts as a resistor, a first insulating film formed on the resistor portion, a bottom surface of the first insulating film contacting to an upper surface of the lower conductive film, and a plurality of contact portions which are formed on the resistor portion and which are formed of the same conductive film as the upper conductive film which are formed at a side of the first insulating film, the contact portions directly contacts to wiring and the lower conductive film, a top of the contact portion being at the same height flush with a top of the first insulating film, the first insulating film being flush with the second element isolation region, and the gate-gate insulating film formed on the first insulating film.

20. The device according to claim 19, wherein a side of the contact portion is in contact with a side of each of the first insulating film and the second element isolation region.

21. The device according to claim 20, wherein the lower conductive film and the upper conductive film of the resistor element are in contact with the second element isolation region, and the second element isolation region is flush with the contact portion.

22. The device according to claim 21, further comprising an upper contact portion which is connected to the contact portion and formed of the same material as the control gate,
wherein the upper contact portion is electrically connected to the contact portion via an opening of the gate-gate insulating film formed on the resistor element, and the first insulating film is formed between the upper contact portion and the resistor portion.

23. The device according to claim 22, wherein the resistor portion includes a lowest conductive film of the lower conductive film.

* * * * *